(12) United States Patent
Zhu

(10) Patent No.: US 11,127,915 B2
(45) Date of Patent: Sep. 21, 2021

(54) OLED DISPLAY DEVICE

(71) Applicant: WUHAN CHINA STAR OPTOELECTRONICS SEMICONDUCTOR DISPLAY TECHNOLOGY CO., LTD., Hubei (CN)

(72) Inventor: Cuilin Zhu, Hubei (CN)

(73) Assignee: WUHAN CHINA STAR OPTOELECTRONICS SEMICONDUCTOR DISPLAY TECHNOLOGY CO., LTD., Hubei (CN)

(*) Notice: Subject to any disclaimer, the term of this patent is extended or adjusted under 35 U.S.C. 154(b) by 494 days.

(21) Appl. No.: 16/302,644

(22) PCT Filed: Sep. 7, 2018

(86) PCT No.: PCT/CN2018/104568
§ 371 (c)(1),
(2) Date: Nov. 18, 2018

(87) PCT Pub. No.: WO2020/042213
PCT Pub. Date: Mar. 5, 2020

(65) Prior Publication Data
US 2021/0226147 A1  Jul. 22, 2021

(30) Foreign Application Priority Data

Aug. 30, 2018 (CN) .......................... 201811001787.8

(51) Int. Cl.
*H01L 51/52* (2006.01)

(52) U.S. Cl.
CPC ...... *H01L 51/52* (2013.01); *H01L 2251/5338* (2013.01)

(58) Field of Classification Search
None
See application file for complete search history.

(56) References Cited

U.S. PATENT DOCUMENTS

| 10,198,041 B2* | 2/2019 | Myeong ............ G02F 1/133305 |
| 10,516,119 B2* | 12/2019 | Lee ...................... H01L 51/5256 |
| 10,873,043 B2* | 12/2020 | Jin ...................... H01L 27/3276 |
| 2014/0226275 A1 | 8/2014 | Ko et al. |
| 2017/0357289 A1 | 12/2017 | Ahn |
| 2018/0095502 A1* | 4/2018 | Yamazaki ............ G06F 1/1643 |
| 2018/0101200 A1* | 4/2018 | Myeong ................ G06F 1/1652 |
| 2019/0036068 A1* | 1/2019 | Kim ....................... G06F 1/1641 |

FOREIGN PATENT DOCUMENTS

| CN | 103985315 A | 8/2014 |
| CN | 107104200 A | 8/2017 |

* cited by examiner

Primary Examiner — J. E. Schoenholtz
(74) Attorney, Agent, or Firm — Soroker Agmon Nordman

(57) ABSTRACT

An OLED (organic light emitting diode) display device includes an OLED display panel, a first backboard and a second backboard. The OLED display panel is provided with at least two support strips located at a bottom surface of the bended region, and the support strips are arranged along a width direction of the OLED display.

16 Claims, 2 Drawing Sheets

OLED DISPLAY DEVICE

BACKGROUND OF THE INVENTION

Field of Invention

The present invention relates to a field of display, and more particularly to a field of an OLED (organic light emitting diode) display device.

Description of Prior Art

In the modern communication industry, market demand for mobile phones, TVs, tablets, notebooks and digital cameras is increasing, and various display devices are also developed in a bendable manner. In the manufacture of flexible full-screen display modules, it is necessary to have a bending process. Nowadays, bending the flexible back plate backwards and setting a bended region under the display region may lead to an arc structure, which is unstable or easy to deform after the bending operation. The unstable structure or deformation is easy to cause circuits in the bended region to be broken. Thus, the product reliability is reduced.

Accordingly, the presently existed OLED (organic light emitting diode) display device has an unstable arc structure or deformed arc structure in a portion of the bended region after the bending operation, and this may cause the circuits of the beaded region to be broken. Thus, the product reliability is reduced.

Currently, the OLED display device has unstable arc structure or arc structure deformation in a portion of the bended region while bending, and it causes the circuits of the bended region to be broken. Thus, product reliability is reduced.

SUMMARY OF THE INVENTION

The present invention provides an OLED (organic light emitting diode), which may stabilize an arc structure in a portion of the bended region during the bending operation, which can solve the current technical problems, such as an unstable arc structure or deformation of the arc structure in a portion of the bended region, and the breakage of the circuits of the bended region caused by the bending, and thus the reduction of the reliability of the product.

In order to solve above-mentioned problems, the present invention provides technical solutions as follows:

The present invention provides an OLED (organic light emitting diode) display device which includes an OLED display panel, a first backboard and a second backboard. The OLED display panel includes a bended region and a non-bended region located at both ends of the bended region, and the first backboard and the second backboard are both located within the non-bended region. The OLED display panel is provided with at least two support strips located at a bottom surface of the bended region, the support strips are arranged along a width direction of the OLED display panel, and the two adjacent strips are spaced from each other with a predetermined interval.

In one embodiment of the present invention, a length of each of the at least two support strips is less than a width of the OLED display panel.

In one embodiment of the present invention, a bending strength of each of the support strips is greater than a bending strength of the OLED display panel.

In one embodiment of the present invention, material of the at least two support strips is stainless steel.

In one embodiment of the present invention, the support trips are fixed on the back surface of the OLED display panel by an attachment or a coating process.

In one embodiment of the present invention, a sum of the widths of the at least two support strips is equal to a length of the OLED display panel located at the bended region.

In one embodiment of the present invention, the at least two each support strips have a circular or elliptical cross-section In one embodiment of the present invention, the at least two support strips each have a polygonal cross-section.

In one embodiment of the present invention, a bending strength of each of the first backboard and the second backboard is greater than a bending strength of the OLED display panel.

In further embodiment of the present invention, the present invention provides an OLED (organic light emitting diode) display device which includes an OLED display panel, a first backboard and a second backboard. The OLED display panel includes a bended region and a non-bended region located at both ends of the bended region, and the first backboard and the second backboard are both located within the non-bended region. The OLED display panel is provided with at least two support strips located at a bottom surface of the bended region, the support strips are arranged along a width direction of the OLED display panel, and the at least two strips are spaced from each other with a predetermined interval.

In one embodiment of the present invention, a length of each of the at least two support strips is less than a width of the OLED display panel.

In one embodiment of the present invention, a bending strength of each of the at least two support strips is greater than the OLED display panel.

In one embodiment of the present invention, material of the at least two support strips is stainless steel.

In one embodiment of the present invention, the at least two support trips are fixed on a back surface of the OLED display panel by an attachment or a coating process.

In one embodiment of the present invention, a sum of the widths of the at least two support strips is equal to a length of the OLED display panel located at the bended region.

In one embodiment of the present invention, the at least two support strips have a circular or elliptical cross-section In one embodiment of the present invention, the at least two support strips have a polygonal cross-section.

In one embodiment of the present invention, a bending strength of the first backboard and the second backboard is greater than a bending strength of the OLED display panel.

The OLED (organic light emitting diode) display device provided by the present application is beneficial to that the OLED display panel is provided with an array of supporting strips, so that the OLED display panel in the bended region is formed into a stable arc shape, which further prevents metal wiring from being bent and cracked, and thus the reliability of the OLED display device is improved.

BRIEF DESCRIPTION OF THE DRAWINGS

In order to more clearly illustrate embodiments or technical solutions in the present invention, the drawings used in the description of the embodiments or current technology will be briefly described below. Obviously, the drawings in the following description are merely some embodiments of the present invention. A person skilled in the art may also obtain other drawings without any creative efforts.

DETAILED DESCRIPTION OF THE PREFERRED EMBODIMENTS

Figure 1:
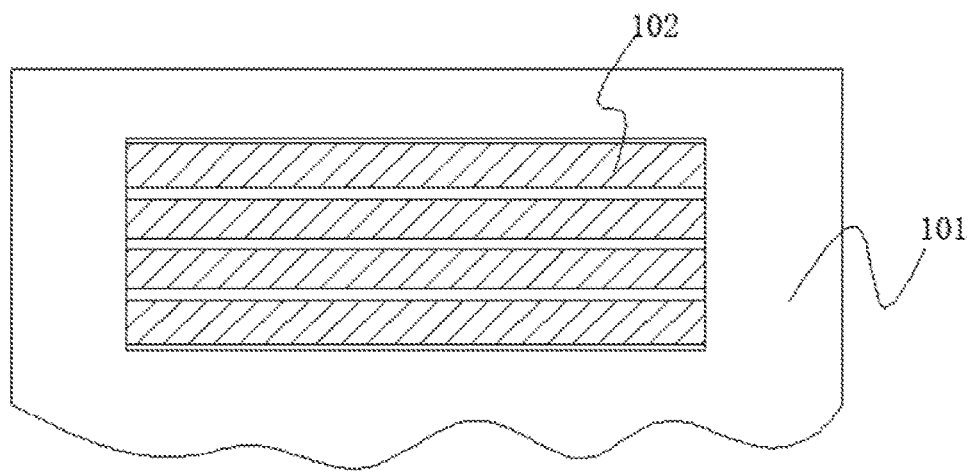
FIG. 1 is a top view of an OLED display panel according to one embodiment of the present invention before being bent.

The following description of the embodiments is provided by reference to the following drawings. Directional terms mentioned in this application, such as "up," "down," "forward," "backward," "left," "right," "inside," "outside," "side," etc., are merely indicated the direction of the drawings. Therefore, the directional terms are used for illustrating and understanding of the application rather than limiting thereof. In the figures, elements with similar structure are indicated by the same reference numerals.

The present invention provides an OLED (organic light emitting diode) to improve drawbacks of currently OLED display device. Currently, the OLED display device has unstable arc structure or arc structure deformation in a portion of the bended region while bending, and it causes the circuits of the bended region to be broken, and thus product reliability is reduced. Accordingly, the present invention provides the embodiments to solve above-mentioned problems.

In one embodiment of the present invention, an OLED display device is provided, and it includes a display panel, a first backboard and a second backboard. The OLED display device includes a bended region and a non-bended region located at both ends of the bended region. The first backboard and the second backboard are both located within the non-bended region. The OLED display panel is provided with at least two support strips located at a bottom surface of the bended region, and the support strips are arranged along a width direction of the OLED display panel.

Referring to FIG. 1, it is a top view of an OLED display panel according to one embodiment of the present invention before being bent. The OLED display device is provided with an OLED display panel 101. The OLED display panel 101 is provided with at least two support strips 102 located at a bottom surface of the bended region, and the support strips 102 are arranged along a width direction of the OLED display panel 101. There is a predetermined interval between each two adjacent support strips 102. A length of the support strips 102 is less than a width of the OLED display panel 102. Material of the support strips is stainless steel. The support strips 102 are fixed on the back surface of the OLED display panel 101 by an attachment or a coating process. The support strips 102 may be selected in different numbers and widths, and the interval between each two adjacent support strips 102 is equal.

Figure 2:
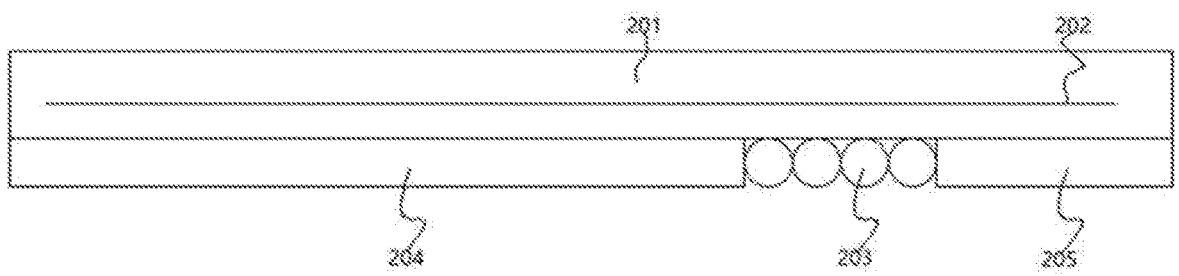
FIG. 2 is a side view of an OLED display panel according to one embodiment of the present invention before being bent.

Referring to FIG. 2, it is a side view of an OLED display panel according to one embodiment of the present invention before being bent. The OLED display device is provided with an OLED display panel 201. Metal wires 202 are disposed on a surface of the OLED display panel 201. The metal wires 201 include a data signal line, an array substrate driving signal line, a power supply voltage signal line and a voltage signal line for circuit common ground terminal, which are connected to a display region of the OLED display panel. The material of the metal wires is Ti/Al/Ti material with good ductility. Each of metal wires has the same shape, but the thicknesses of the metal wires are not totally the same. The wider metal wires 202 are used as power supply voltage signal lines, circuit ground signal lines or array substrate driving signal lines, and the narrower metal wires 301 are used as data signal lines.

A first backboard 204 and a second backboard 205 are disposed on a backside surface of the OLED display panel 201. The first backboard 204 and the second backboard are both located within the non-bended region. A length of the first backboard 201 is greater than a length of the second backboard 20. A bending strength of each of the first backboard 204 and the second backboard 205 is greater than a bending strength of the OLED display panel, so that the first backboard 204 and the second backboard 205 support an unbent portion of the OLED display panel 201 when the bended region of the OLED display panel 201 is bent. The main body of the first back plate 204 and the second back plate 205 may be selected from stainless steel plates, and of course, it is not limited to other metal materials such as aluminum plates, iron plates, etc., and plastic materials are also included.

The OLED display panel 201 is provided with at least two support strips 203 located at a bottom surface of the bended region, the support strips are arranged along a width direction of the OLED display panel 201, and there is a predetermined interval between each two adjacent support strips 203. The support strips 203 are fixed on the back surface of the OLED display panel 201 by an attachment or a coating process, and the attachment or the coating process is simple and effective to fix, and is extremely strong, and thus it may ensure that the support strips 203 do not easily detach from the OLED display panel 201 while bending. A bending strength of each of the support strips 203 is greater than the bending strength of the OLED display panel 201. Conventionally, the bending strength of a material is defined that a maximum stress that the material may withstand when it breaks under a bending load or reaches a specific deflection. The fact that the bending strength of the support strips 203 greater than the bending strength of the OLED display panel 201 can ensure that the bending force acting on the OLED display panel 201 is more supported by the support strips 203 during the bending process, thereby reducing the possibility of that the OLED display panel 201 is unstably and unevenly deformed at the bended region.

Preferably, the support strips each have a circular or an elliptical or a polygonal cross-section.

Figure 3:
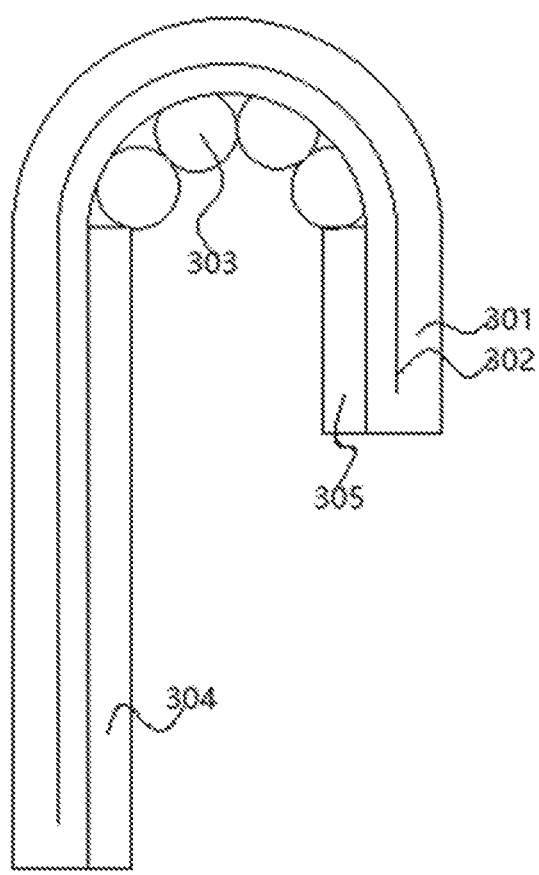
FIG. 3 is a side view of an OLED display panel according to one embodiment of the present invention after being bent.

Referring to FIG. 3, it is a side view of an OLED display panel according to the embodiment of the present invention after being bent. The OLED display device is provided with an OLED display panel 301. Metal wires 302 are disposed on a surface of the OLED display panel 301. A first backboard 304 and a second backboard 305 are both located within the non-bended region. The OLED display panel 301 is provided with at least two support strips 303 located at a bottom surface of the bended region, the support strips 303 are arranged along a width direction of the OLED display panel 301, and there is a predetermined interval between each two adjacent support strips 303. When the OLED display panel 301 is bent, the support strips 303 are in contact with each other under the bending force. The support strips 303 are attached to the OLED display panel 301. A bending portion of the OLED display panel is influenced by the tension of the support strips 303, and the force of the support strip 303 is applied to the OLED display panel 301, and a shape of the bending portion of the OLED display panel 301 is stabilized by the force of the support strips 303. A bending strength of each of the support strips 303 is greater than a bending strength of the OLED display panel 301. The fact that the bending strength of the support strips 303 is greater than the bending strength of the OLED display panel 301 can ensure that the bending force acting on the OLED display panel 301 is more supported by the support strips 303 during the bending process, thereby reducing the possibility of that the OLED display panel 301 is unstably and unevenly deformed at the bended region.

Accordingly, the OLED display device provided by the present application is beneficial to that the OLED display panel is provided with a row of supporting strips, so that the OLED display panel in the bended region is formed into a stable arc shape, which further prevents metal wiring from being bent and cracked, and thus the reliability of the OLED display device is improved.

In the above, although the present application has been described in the above preferred embodiments, the preferred embodiments are not intended to limit the application, and a person skilled in the art may make various modifications without departing from the spirit and scope of the application. The scope of the present application is determined by claims.

What is claimed is:

1. An OLED (organic light emitting diode) display device comprising:
    an OLED display panel, wherein the OLED display panel comprises a bended region and a non-bended region located at both ends of the bended region; and
    a first backboard and a second backboard, wherein the first backboard and the second backboard are both located within the non-bended region;
    wherein the OLED display panel is provided with at least two support strips located at a bottom surface of the bended region and, the support strips are arranged along a width direction of the OLED display panel, and the at least two support strips are spaced from each other with a predetermined interval;
    wherein a sum of the widths of the at least two support strips are equal to a length of the OLED display panel located at the bended region.

2. The OLED display device of claim 1, wherein a length of each of the at least two support strips is less than a width of the OLED display panel.

3. The OLED display device of claim 1, wherein a bending strength of each of the at least two support strips is greater than a bending strength of the OLED display panel.

4. The OLED display device of claim 1, wherein material of each of the at least two support strips is stainless steel.

5. The OLED display device of claim 1, wherein the at least two support strips are fixed on a back surface of the OLED display panel by an attachment or a coating process.

6. The OLED display device of claim 1, wherein the at least two support strips each have a circular or elliptical cross-section.

7. The OLED display device of claim 1, wherein the at least two support strips each have a polygonal cross-section.

8. The OLED display device of claim 1, wherein a bending strength of each of the first backboard and the second backboard is greater than a bending strength of the OLED display panel.

9. An OLED (organic light emitting diode) display device comprising:
    an OLED display panel, wherein the OLED display panel comprises a bended region and a non-bended region located at both ends of the bended region; and
    a first backboard and a second backboard, wherein the first backboard and the second backboard are both located within the non-bended region;
    wherein the OLED display panel is provided with at least two support strips located at a bottom surface of the bended region; and the support strips are arranged along a width direction of the OLED display panel;
    wherein a sum of the widths of the at least two support strips is equal to a length of the OLED display panel located at the bended region.

10. The OLED display device of claim 9, wherein a length of each of the at least two support strips is less than a width of the OLED display panel.

11. The OLED display device of claim 9, wherein a bending strength of each of the at least two support strips is greater than a bending strength the OLED display panel.

12. The OLED display device of claim 9, wherein material of each of the at least two support strips is stainless steel.

13. The OLED display device of claim 9, wherein the at least two support strips are fixed on a back surface of the OLED display panel by an attachment or a coating process.

14. The OLED display device of claim 9, wherein the at least two support strips each have a circular or elliptical cross-section.

15. The OLED display device of claim 9, wherein the at least two support strips each have a polygonal cross-section.

16. The OLED display device of claim 9, wherein a bending strength of each of the first backboard and the second backboard is greater than a bending strength of the OLED display panel.

* * * * *